United States Patent [19]

Ishiwata et al.

[11] Patent Number: 5,830,608
[45] Date of Patent: Nov. 3, 1998

[54] PROCESS FOR PREPARING FILTER

[75] Inventors: Kazuya Ishiwata, Yokosuka; Toshifumi Yoshioka, Hadano, both of Japan

[73] Assignee: Canon Kabushiki Kaisha, Tokyo, Japan

[21] Appl. No.: 962,820

[22] Filed: Nov. 3, 1997

Related U.S. Application Data

[60] Continuation of Ser. No. 542,864, Oct. 13, 1995, abandoned, which is a division of Ser. No. 13,796, Feb. 5, 1993, Pat. No. 5,482,803.

[30] Foreign Application Priority Data

Feb. 7, 1992 [JP] Japan .................................. 4-055990
Feb. 17, 1992 [JP] Japan .................................. 4-061529

[51] Int. Cl.⁶ ............................ G02B 5/20; G02F 1/1335
[52] U.S. Cl. .............................. 430/7; 430/321; 430/328
[58] Field of Search ................... 430/7, 20, 328, 430/283.1, 321; 349/106

[56] References Cited

U.S. PATENT DOCUMENTS

| 3,890,176 | 6/1975 | Bolon ......................................... 430/328 |
| 4,802,743 | 2/1989 | Takao et al. .............................. 359/68 |
| 4,818,075 | 4/1989 | Takao et al. .............................. 359/68 |
| 4,837,098 | 6/1989 | Shimamura et al. ...................... 430/7 |
| 4,917,471 | 4/1990 | Takao et al. .............................. 359/68 |
| 5,177,627 | 1/1993 | Ishiwata et al. .......................... 359/68 |
| 5,185,059 | 2/1993 | Nishida et al. ........................... 216/23 |
| 5,279,913 | 1/1994 | Van Doorn ................................ 430/7 |
| 5,482,803 | 1/1996 | Ishiwata et al. .......................... 430/7 |

FOREIGN PATENT DOCUMENTS

| 60-60725 | 4/1985 | Japan ...................................... 430/328 |
| 61-77852 | 4/1986 | Japan ...................................... 430/328 |
| 62-11824 | 1/1987 | Japan ...................................... 430/20 |
| 4-40401 | 2/1992 | Japan ...................................... 430/7 |
| 4-51222 | 2/1992 | Japan . |

OTHER PUBLICATIONS

Abstract of JP 63–298242, "Formation of Photosensitive Resin Layer," Fujita (Dec. 1988).

*Primary Examiner*—John A. McPherson
*Attorney, Agent, or Firm*—Fitzpatrick, Cella, Harper & Scinto

[57] ABSTRACT

A filter completely free from resin residues remaining on the glass substrate surface in the photolithographic process is prepared with a high production efficiency by applying a photosensitive resin to a substrate surface, subjecting the applied resin to light exposure and development by photolithography, and heating the resin, thereby baking the resin, where the substrate surface is irradiated with an ultraviolet ray in an oxygen-containing atmosphere, before and/or after the baking, thereby removing residues remaining on the substrate surface due to the development.

28 Claims, 2 Drawing Sheets

PROCESS FOR PREPARING FILTER

This application is a continuation, of application Ser. No. 08/542,864, filed Oct. 13, 1995, now abandoned, which is, in turn, a division of application Ser. No. 08/013,796, filed Feb. 5, 1993, now U.S. Pat. No. 5,482,803, issued Jan. 9, 1996.

BACKGROUND OF THE INVENTION

1. Field of the Invention

The present invention relates to a process for preparing a filter, and more particularly to a process for preparing a filter suitably applicable to a color display in liquid crystal display devices, etc.

2. Related Background Art

Color filters are of many types, among which such a type is well known as that based on a colored resin film composed of a mixture of a photosensitive resin and a coloring material because of its relatively good heat resistance and simple process steps.

Generally, a color filter has been so far formed on a substrate by patterning according to a photolithographic process, where the patterning is carried out by applying a colored resin to a substrate by an ordinary coating procedure such as spinner method, printing method, roll coater method, etc., then prebaking the applied resin on a hot plate or in an oven, exposing the prebaked resin to light through a photomask, dipping the resin into a developing solution, thereby conducting development, followed by postbaking with heating again at a higher temperature than the prebaking temperature to form a pattern for a color filter.

A substrate for a liquid crystal display device has been so far prepared by forming a transparent insulating film on the thus formed color filter mainly to make surface flattening, then forming a transparent electrode, and further a metallic electrode, etc. thereon successively, followed by patterning to obtain a substrate provided with a color filter having a plurality of stripe-form electrodes.

As the transparent insulating film, inorganic films of $SiO_2$, $TaO_x$, etc., transparent resin films, photosensitive transparent resin films, etc. have been so far used, and with patterning in some cases.

However, in the above-mentioned conventional process, particularly when the colored resin applied to the substrate is exposed to light and developed in the developing solution by photolithographic process, the chemical dissolution rate of non-exposed parts is low, and in some cases a coupling agent is contained in the colored resin to improve the adhesiveness between the colored resin on the light-cured parts and the substrate. Particularly near the interface of the substrate, the colored resin of non-exposed parts cannot be completely removed, even if the dipping time in the developing solution is prolonged until the surfaces of light-cure parts are roughened, and sometimes the colored resin remains as residues on the interface of the substrate.

The residues can be removed to some extent by washing with a solvent, etc. but it is very difficult to completely remove the residues. That is, the residues often remain as a very thin layer on the substrate surface. In the successive step of forming another color film or forming a transparent electrode or a metallic electrode as a film, followed by patterning, the residues deteriorate the adhesiveness between these films and the substrate and thus serve as a cause for peeling of these films. Particularly at the mounting part where a liquid crystal panel of a liquid crystal display device is connected to a driver for driving the device, a physically large force is easily applicable to the mounted electrode on the substrate to readily peel the mounted electrode from the substrate. A result of such peeling lowers the yield or durability of liquid crystal display devices as important disadvantages.

SUMMARY OF THE INVENTION

An object of the present invention is to improve the disadvantages of the conventional process and to provide a process for preparing a filter with complete removal of the resin residues on the substrate surface due to photolithography, and also with an improved production efficiency.

Another object of the present invention is to provide a process for preparing a filter comprising a step of irradiation with an ultraviolet ray in an oxygen-containing atmosphere such as air before and/or after postbaking to resin.

Other object of the present invention is to provide a process for preparing a filter, which comprises applying a photosensitive resin to a substrate surface, subjecting the applied resin to light exposure and development by photolithography, heating the resin, thereby baking the resin, and then irradiating the substrate surface with an ultraviolet ray in an oxygen-containing atmosphere, thereby removing residues remaining on the substrate surface due to the development.

Further object of the present invention is to provide a process for preparing a filter, which comprises applying a photosensitive resin to a substrate surface, subjecting the applied resin to light exposure and development by photolithography, irradiating the substrate surface with an ultraviolet ray in an oxygen-containing atmosphere, thereby removing residues remaining on the substrate surface due to the development, and then heating the resin, thereby baking the resin.

DETAILED DESCRIPTION OF THE PREFERRED EMBODIMENTS

Figure 1A:
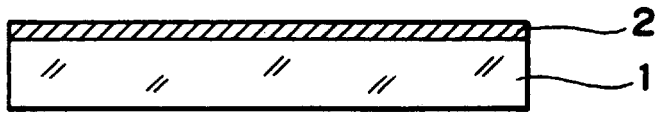
FIGS. 1A to 1E and 2A to 2E show process steps according to embodiments of the present process for preparing a filter, respectively.

The above-mentioned problems of the conventional process can be solved by irradiating the applied resin with a UV ray in air or an oxygen-containing atmosphere before and/or after postbaking of the resin in the present invention.

The irradiation with a UV ray in the present invention is directed to cleaning of the substrate surface by generation or formation of ozone. That is, the resin of non-exposed parts remaining on the substrate surface is removed with ozone generated by irradiation with a UV ray to improve the adhesiveness between the substrate and a film or films such as another resin, a transparent electrode, a metallic electrode, an insulating film, etc. as films to be successively formed thereon.

In the present invention, not only the resin residues of non-exposed parts, but also particles attached to the substrate surface, when subjected to pattern exposure or development, can be removed at the same time. That is, a probability of remaining contaminant on an image element can be lowered and the production yield can be improved in the present invention.

A color filter prepared according to the present process has a high adhesiveness between the substrate and a film or films formed in the successive steps, such as a patterned transparent electrode, metallic electrode, etc. as films, owing to the complete removal of the remaining residues from the substrate surface. No peeling of a mounted electrode from the substrate occurs even at the mounted parts where the liquid crystal panel is connected to the driver for driving the panel and substrates provided with a color filter can be produced in good production yield.

It is desirable to select an irradiation energy level of ultraviolet (UV) ray to the substrate surface in view of the state of residues to be removed or the state of the resin to remain. Thus, generally it is preferable to select an irradiation energy level of 2 to 20 J/cm$^2$ when the resin patterned on the substrate surface before postcuring and an irradiation energy level of 5 to 20 J/cm$^2$ after the postcuring. However, the irradiation energy level is adjustable, when required, as mentioned above. If the irradiation energy level is too low, the residues to be removed cannot be removed, whereas if it is too high, there is a high possibility to damage the patterned resin to a greater extent than required. Thus, the irradiation energy level must be carefully selected.

A UV ray of any wavelength can be used for the irradiation, so far as it can activate the oxygen in the air or the oxygen-containing atmosphere. Specifically, an applicable wavelength range for the UV ray is 150 nm to 400 nm.

Any light source for the UV ray irradiation can be used, so far as it contains the wavelength component in the above-mentioned range, and includes, for example, lasers such as an exima laser such as KrF laser, ArF laser, XeCl laser, XeF laser, etc., YAG laser, etc., and discharge lamps such as Xenon-arc lamp, mercury lamp, arc lamp, fluorescent chemical lamp, black light fluorescent lamp, etc.

Irradiation of UV ray can be carried out all over the substrate surface or only onto the necessary parts by laser scanning or by a mask. Irradiation of UV ray only onto the necessary parts is very preferable, because it is substantially unnecessary to take damages of patterned resin into consideration.

The present invention will be explained in detail below, referring to the drawings.

At first, explanation will be made based on a case where the irradiation of UV ray is carried out before postbaking of the resin.

FIGS. 1A to 1E are schematic cross-sectional views showing process steps according to one embodiment of the present process for preparing a filter.

Figure 1B:
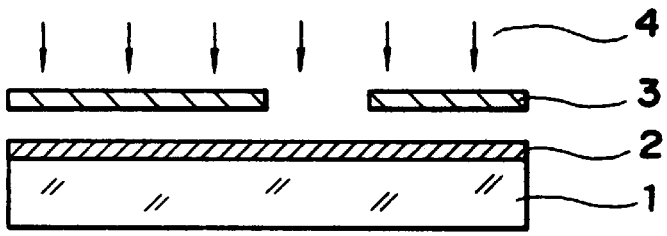
Figure 1C:
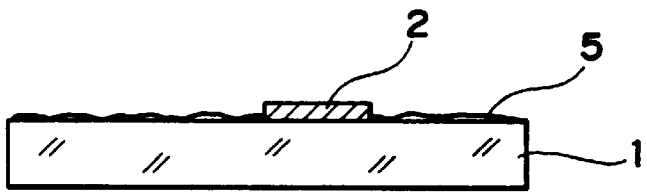

A coating film 2 of color filter material is formed on a glass substrate 1 by a spinner method and prebaked (FIG. 1A). Then, the film 2 is subjected to light exposure with a UV ray 4 through a photomask 3 by a light-exposing apparatus (FIG. 1B). After the light exposure, steps of development, rinsing and drying are carried out (FIG. 1C). After the step of development, residues 5 remain substantially as a monomolecular layer on the substrate surface.

Figure 1D:
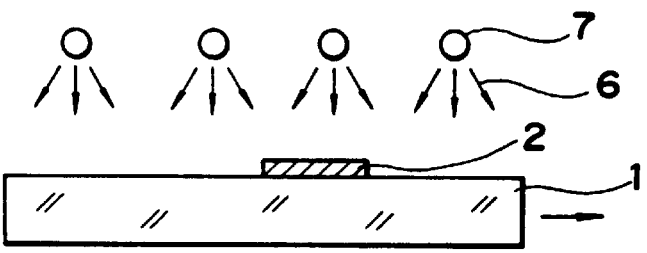
Figure 1E:
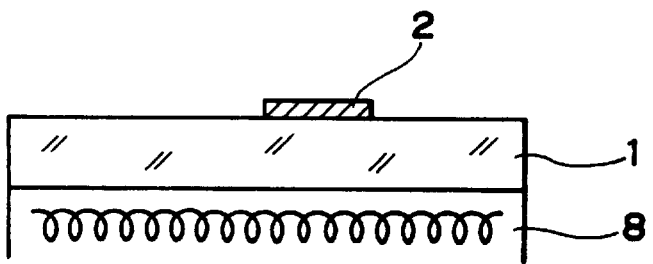

Then, the substrate surface is irradiated with a UV ray 6 at a level of 2 to 20 J/cm$^2$ in the air from a UV lamp 7 to decompose and remove the residues 5 (FIG. 1D). Then, the substrate is heated again on a hot plate 8 to postbake the resin, thereby forming a color filter (FIG. 1E). In order to form a color filter of various color materials, for example, R (red), G (green) and B (blue), the steps as shown in FIGS. 1A to 1E must be carried out repeatedly only by the number of required color species.

Explanation will be made on another case where the irradiation of UV ray is carried out after postbaking of the resin.

FIGS. 2A to 2E are schematic cross-sectional views showing process steps according to another embodiment of the present process for preparing a filter.

Figure 2A:
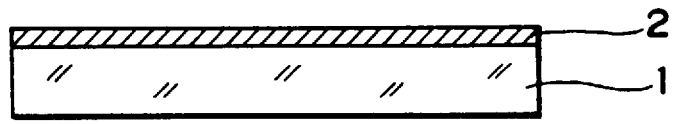
Figure 2B:
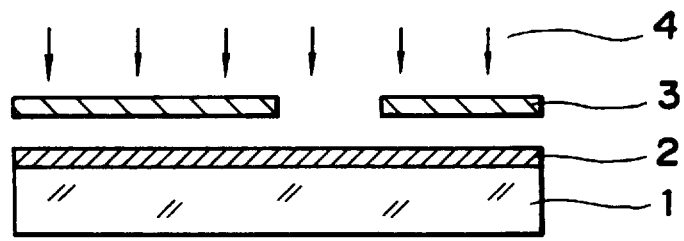
Figure 2C:
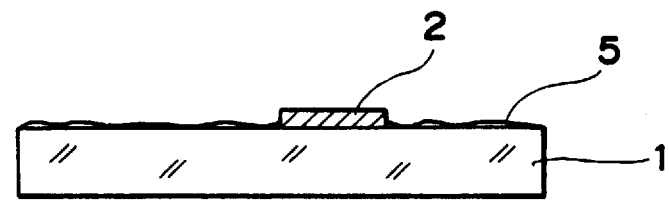

A coating film 2 of color filter material is formed on a glass substrate 1 by a spinner method and prebaked (FIG. 2A). Then, the film is subjected to light exposure with a UV ray 4 through a photomask 3 by a light-exposing apparatus (FIG. 2B). After the light exposure, steps of development, rinsing and drying are carried out (FIG. 2C). After the step of development, residues 5 remain substantially as a monomolecular layer on the substrate surface.

Figure 2D:
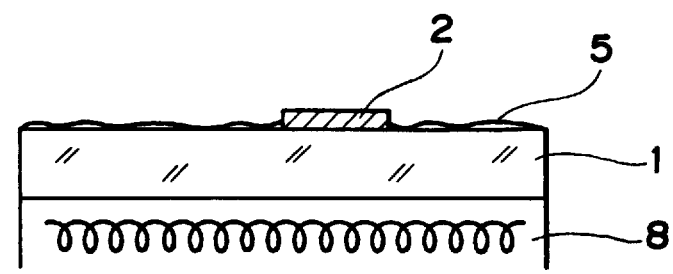
Figure 2E:
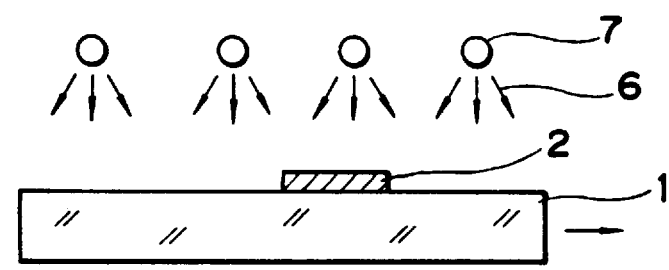

Then, the substrate is heated again on a hot plate 8 to postbake the resin, thereby forming a color filter (FIG. 2D). After the postbaking, the substrate surface is irradiated with a UV ray 6 at a level of 5 to 20 J/cm$^2$ in the air from a UV lamp 7 to decompose and remove the residues 5 (FIG. 2E). In order to form a color filter of various color materials, for example, R (red), G (green) and B (blue) also in this case, the steps as shown in FIGS. 2A to 2E must be carried out repeatedly only by the number of required color species.

In the foregoing explanation, a color material, such as pigments or dyes, is contained in a resin to be patterned, but it is not always necessary that the color material is contained in the resin. For example, a transparent resin is patterned at first, and then colored with a dye or a pigment to make a color filter. In the latter case, removal of residues by irradiation with a UV ray can be carried out before or after the coloring.

In case of a colored resin, it is preferable to use a photosensitive resin containing at least one coloring material as dispersed therein. Preferable photosensitive resins are resins composed of polyamide or polyimide as a main component, among which more preferable are aromatic polyamide or polyimide resins containing photosensitive groups in the molecule.

Specifically, resins capable of forming a baked film at a temperature of not more than 200° C., for example, forming a baked film by heating at 150° C. for about 30 minutes, and particularly having no specific light-absorbing characteristics in the visible light wavelength region (400 to 700 nm) (a light transmittance of about 90% or more) are preferable. Aromatic polyamide resins are particularly preferable from this point of view.

As the photosensitive groups, the following aromatic chains having a photosensitive, unsaturated hydrocarbon group can be mentioned as preferable:

(1) Benzoic acid esters:

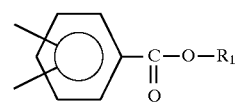

where R$_1$ represents CHX=CY—COOZ, wherein X is —H or —C$_6$H$_5$; Y is —H or —CH$_2$; and Z is a single bond, or an ethyl group or a glycidyl group.

(2) Benzyl acrylates:

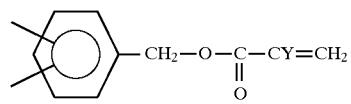

wherein Y is —H or —CH$_3$.

(3) Diphenyl ethers:

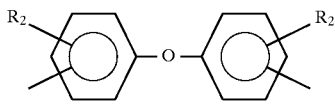

where $R_2$ is at least one of CHX=CY—CONH—, $CH_2$=CY—COO—$(CH_2)_2$—OCO— and $CH_2$=CY-COO-$CH_2$—, and X and Y have the same meanings as defined above.

(4) Chalcones and other compounds:

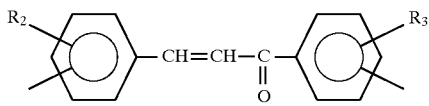

where $R_3$ is H—, an alkyl group or an alkoxy group.

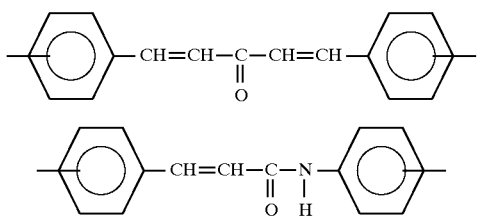

Examples of these aromatic polyamide and polyimide resins containing these groups in the molecule include Lithocoat PA-1000 (tradename of a product made by Ube Kosan K. K., Japan), Lithocoat PI-400 (tradename of a product made by Ube Kosan K. K., Japan), etc.

Generally, only a few photosensitive resins for use in the photolithographic process have good mechanical characteristics, heat resistance, light resistance, solvent resistance and other durabilities, though there are differences in the chemical structures. On the other hand, the above-mentioned photosensitive resins belong to a resin system having distinguished durabilities even from the viewpoint of their chemical structures, and color filters made from these resins can have very good durabilities.

As the coloring materials for the colored resin layer of the color filter, any of organic and inorganic pigments, dyes, etc. can be used, so far as it has desired spectroscopic characteristics. In that case, these coloring materials can be used alone or in a mixture of some of these materials. When a dye is used, the characteristics of a color filter depend on the durabilities of the dye itself, but in the case of the above-mentioned resin system, a color filter having distinguished characteristics can be formed, as compared with the ordinary dyed color filter. That is, organic pigments are most preferable coloring materials from the viewpoints of color characteristics and other characteristics of a color filter.

Organic pigments for use in the present invention include azo pigments such as soluble azo pigments, insoluble azo pigments, condensed azo pigments, etc.; phthalocyanine pigments; indigo pigments; anthraquinone pigments; perylene pigments; perynone pigments; dioxane pigments, quinacridone pigments, isoindolynone pigments, phthalone pigments, methine.azomethine pigments, and other condensed polycylic pigments containing metal complex, or a mixture of some of these pigments.

A colored resin can be applied to a substrate, for example, by a spinner method, printing method, roll coater method, etc. Particularly, coating by spinner method is preferable since the film has a good uniformity in the film thickness.

Effects on the decomposition and removal of the residues can be observed simply by rubbing the surface. For more precise observation, a contact angle on a glass substrate surface is measured to check the state of surface energy (anchoring energy). The simplest procedure for measuring a contact angle is based on a difference between the contact angle of e.g., $H_2O$ on a plain glass surface (glass substrate surface right after rinsing), i.e. 4.2° and that on a part of the glass substrate surface after coating with a filter material, light exposure and development, i.e. the part that is deemed to be free from the filter material, i.e. 46° according to the conventional process, which means that there are residues of the filter material or components of developing solution to a thickness of a few tens to a few hundred Å.

In the present invention, the components of the residues have not be able to be identified, and thus will be referred to simply as the components of filter material residues. The components of filter material can be decomposed and cleaned by irradiation with UV ray as shown in FIGS. 1D and 2E, and it has been found that the contact angle on the substrate surface can be made equivalent to that on the plain glass surface thereby.

The oxygen-containing atmosphere for the irradiation with the UV ray can be air. In order to prevent the unwanted contamination of substrate surface, it is preferable to use the air or a gas mixture of an oxygen gas with other gas, for example, an inert gas such as N, Ar, etc. after passing it through a filter for removing dust.

The present invention will be explained in detail below, referring to Examples.

EXAMPLE 1

A color filter was prepared according to the process steps shown in FIGS. 1A to 1E.

At first, a metallic Cr film was formed to a thickness of about 800 Å on a glass substrate 1 by a sputtering method, and a necessary pattern was formed by photolithography. Then, a film 2 of color filter material composed mainly of a negative type, photosensitive polyamide containing a pigment was applied thereto to a thickness of 1.6 μm by a spinner method (FIG. 1A) and then prebaked on a hot plate at 80° C. for 10 minutes, and irradiated with a UV ray 4 at a level of 100 to 600 mJ/cm² through a photomask 3 (FIG. 1B), whereby the color filter material was photobaked through the irradiation with the UV ray.

Then, the unbaked parts were removed by dipping the substrate in a developing solution, and the substrate was subjected to steps of rinsing, washing and drying. A contact angle of $H_2O$ on the peripheral parts (residues) 5 without the thus formed color filter pattern on the substrate was found to be about 46° (FIG. 1C).

Then, the substrate with the color filter pattern was irradiated with a UV ray 6 at a level of 5 J/cm² from an UV lamp 7, whereby the contact angle of $H_2O$ on the peripheral parts without the color filter pattern on the substrate 1 was changed to 12° (FIG. 1D). Then, the substrate 1 was heated on a hot plate 8 at 200° C. for 10 minutes to postbake the color filter material (FIG. 1E). The foregoing steps were carried out for each of R (red), G (green) and B (blue) (FIGS. 1A to 1E) to form a color filter substrate for display.

An ITO film and a metallic film as an auxiliary electrode were each formed on the thus prepared substrate by sputtering and then patterned by photolithography, and then an insulating layer was formed thereon, and further an orienting film was formed thereon, followed by rubbing thereon. The thus prepared substrate was bonded to a counter substrate with a space therebetween.

Then, a highly dielectric liquid crystal was provided into the space, and the opening was sealed. TABIC was connected to the mounted members. A very good adhesiveness was obtained between the mounted members.

EXAMPLE 2

Another color filter was prepared according to the process steps shown in FIGS. 1A to 1E.

At first, a metallic Cr film was formed to a thickness of about 800 Å on a glass substrate 1 by sputtering method, and a necessary pattern was formed by photolithography. Then, a film 2 of color filter material composed mainly of a negative type, photosensitive polyamide containing a pigment was applied thereto to a thickness of 1.6 μm by a spinner method (FIG. 1A) and then prebaked on a hot plate at 80° C. for 10 minutes, and irradiated with a UV ray 4 at a level of 100 to 600 mJ/cm$^2$ through a photomask 3 (FIG. 1B), whereby the color filter material was photobaked through the irradiation with the UV ray.

Then, the unbaked parts were removed by dipping the substrate in a developing solution, and the substrate was subjected to steps of rinsing, washing and drying. A contact angle of H$_2$O on the peripheral parts (residues) 5 without the thus formed color filter pattern on the substrate was found to be about 46° (FIG. 1C).

Then, the substrate with the color filter pattern was irradiated with a UV ray 6 at a level of 15 J/cm$^2$ from an UV lamp 7, whereby the contact angle of H$_2$O on the peripheral parts without the color filter pattern on the substrate 1 was changed to 4.6° (FIG. 1D). Then, the substrate 1 was heated in a clean oven at 250° C. for 60 minutes to postbake the color filter material (FIG. 1E). The foregoing steps were carried out for each of R (red), G (green) and B (blue) (FIGS. 1A to 1D) to form a color filter substrate for display.

An ITO film and a metallic film as an auxiliary electrode were each formed on the thus prepared substrate by sputtering and then patterned by photolithography, and then an insulating layer was formed thereon, and further an orienting film was formed thereon, followed by rubbing thereon. The thus prepared substrate was bonded to a counter substrate with a space therebetween.

Then, a highly dielectric liquid crystal was provided into the space, and the opening was sealed. TABIC was connected to the mounted members. A very good adhesiveness was obtained between the mounted members.

EXAMPLE 3

Other color filter was prepared according to the process steps shown in FIGS. 2A to 2E.

At first, a metallic Cr film was formed to a thickness of about 800 Å on a glass substrate 1 by a sputtering method, and a necessary pattern was formed by photolithography. Then, a film 2 of color filter material composed mainly of a negative type, photosensitive polyamide containing a pigment was applied thereto to a thickness of 1.6 μm by a spinner method (FIG. 2A) and then prebaked on a hot plate at 80° C. for 10 minutes, and irradiated with a UV ray 4 at a level of 100 to 600 mJ/cm$^2$ through a photomask 3 (FIG. 2B), whereby the color filter material was photobaked through the irradiation with the UV ray.

Then, the unbaked parts were removed by dipping the substrate in a developing solution, and the substrate as subjected to steps of rinsing, washing, drying and postbaking. A contact angle of H$_2$O on the peripheral parts (residues) 5 without the thus formed color filter pattern on the substrate was found to be about 53° (FIGS. 2C and 2D).

Then, the substrate with the color filter pattern was irradiated with a UV ray 6 at a level of 5 J/cm$^2$ from an UV lamp 7, whereby the contact angle of H$_2$O on the peripheral parts without the color filter pattern on the substrate 1 was changed to 20° (FIG. 2E). The foregoing steps were carried out for each of R (red), G (green) and B (blue) (FIGS. 2A to 2E) to form a color filter substrate for display.

An ITO film and a metallic film as an auxiliary electrode were each formed on the thus prepared substrate by sputtering and then patterned by photolithography, and then an insulating layer was formed thereon, and further an orienting film was formed thereon, followed by rubbing thereon. The thus prepared substrate was bonded to a counter substrate with a space therebetween.

Then, a highly dielectric liquid crystal was provided into the space, and the opening was sealed. TABIC was connected to the mounted members. A very good adhesiveness was obtained between the mounted members.

EXAMPLE 4

A further color filter was prepared according to the process steps shown in FIGS. 2A to 2E.

At first, a metallic Cr film was formed to a thickness of about 800 Å on a glass substrate 1 by sputtering method, and a necessary pattern was formed by photolithography. Then, a film 2 of color filter material composed mainly of a negative type, photosensitive polyamide containing a pigment was applied thereto to a thickness of 1.6 μm by a spinner method (FIG. 2A) and then prebaked on a hot plate at 80° C. for 10 minutes, and irradiated with a UV ray 4 at a level of 100 to 600 mJ/cm$^2$ through a photomask 3 (FIG. 2B), whereby the color filter material was photobaked through the irradiation with the UV ray.

Then, the unbaked parts were removed by dipping the substrate in a developing solution, and the substrate was led to steps of rinsing, washing, drying and postbaking. A contact angle of H$_2$O on the peripheral parts (residues) 5 without the thus formed color filter pattern on the substrate was found to be about 53° (FIGS. 2C and 2D).

Then, the substrate with the color filter pattern was irradiated with a UV ray 6 at a level of 20 J/cm$^2$ from an UV lamp 7, whereby the contact angle of H$_2$O on the peripheral parts without the color filter pattern on the substrate 1 was changed to 8° (FIG. 2E). The foregoing steps were carried out for each of R (red), G (green) and B (blue) (FIGS. 2A to 2E) to form a color filter substrate for display.

An ITO film and a metallic film as an auxiliary electrode were each formed on the thus prepared substrate by sputtering and then patterned by photolithography, and then an insulating layer was formed thereon, and further an orienting film was formed thereon, followed by rubbing thereon. The thus prepared substrate was bonded to a counter substrate with a space therebetween.

Then, a highly dielectric liquid crystal was provided into the space, and the opening was sealed. TABIC was connected to the mounted members. A very good adhesiveness was obtained between the mounted members.

As explained above, the present invention can provide a substrate provided with a color filter thereon with a distinguished adhesiveness between the mounted members by decomposing and removing residue components of color filter material remaining on the substrate surface by irradiation with a UV ray before or after postbaking of resin after development and patterning in the process for forming a color filter on a substrate, and the present invention is particularly effective for color filter materials containing a negative type, photosensitive resin.

Irradiation with the UV ray after the development and before the postbaking requires less energy for the decomposition and removal of the residue components than that after the postbaking and can more readily decompose and remove the residue components uniformly all over the entire substrate surface.

In the present invention, the residues 5 remaining on the glass substrate surface in the development step may be removed by irradiation with a UV ray after all color species of the color filter, for example, three color species such as red, green and blue or four color species such as red, green, blue and colorless, have been disposed by patterning.

Furthermore, as mentioned above, is also possible to conduct irradiation with a UV ray before the postbaking, then conduct the postbaking and again conduct irradiation with a UV ray, if necessary.

What is claimed is:

1. A process for manufacturing a liquid crystal device, comprising the steps of:
   preparing a filter comprising sequentially (i) applying at least one of a photosensitive polyimide or polyamide resin to a first substrate surface; (ii) subjecting the photosensitive resin to light exposure and development by photolithography to form a patterned resin; (iii) selectively irradiating necessary parts except the patterned resin on the first substrate surface with an ultraviolet ray having an irradiation energy in the range of 2 to 20 J/cm$^2$ in an oxygen-containing atmosphere to remove development residue remaining on the first substrate surface; and (iv) baking said developed resin;
   forming a transparent electrode pattern on the filter;
   bonding the first substrate and a counter substrate with a space therebetween; and
   introducing a liquid crystal into said space.

2. A process according to claim 1, which further comprises a step of forming an insulating film on the transparent electrode in the first substrate and forming an orientation film on the insulating film.

3. A process according to claim 2, wherein the orientation film is rubbed.

4. A process according to claim 1, which further comprises the steps of:
   forming mounted electrodes in the first and counter substrates; and
   connecting drivers to the mounted electrodes.

5. A process according to claim 1, wherein the photosensitive resin is applied to the first substrate by spinner method.

6. A process according to claim 1, wherein the photosensitive resin mainly comprises polyamide.

7. A process according to claim 6, wherein the photosensitive resin is an aromatic resin.

8. A process according to claim 1, wherein the photosensitive resin mainly comprises polyimide.

9. A process according to claim 8, wherein the photosensitive resin is an aromatic resin.

10. A process according to claim 1, wherein the photosensitive resin contains a coloring material.

11. A process according to claim 1, wherein the oxygen-containing atmosphere is air.

12. A process according to claim 1, further comprising a step of dyeing the photosensitive resin.

13. A process according to claim 1, wherein the photosensitive resin is prebaked by heating after being applied to the first substrate and before the light exposure.

14. A process according to claim 1, wherein the steps of applying the photosensitive resin to the first substrate, light exposure and development are repeated at least twice.

15. A process according to claim 1, wherein the filter is at least one of red, green, blue or colorless.

16. A process for manufacturing a liquid crystal according to claim 1, further comprising:
   forming an insulating film on the transparent electrode in the first substrate.

17. A process according to claim 1, wherein step (iii) is conducted using laser scanning or using a mask.

18. A process for preparing a photosensitive resin filter composed mainly of at least one of a polyimide resin or a polyamide resin, comprising the sequential steps of:
   a) applying said resin to a substrate surface;
   b) subjecting the applied resin to light exposure and development by photolithography to form a patterned resin;
   c) selectively irradiating necessary parts except the patterned resin on the substrate surface with an ultraviolet ray having an irradiation energy within the range of 2 to 20 J/cm$^2$ in an oxygen-containing atmosphere to remove development residue remaining on the substrate surface; and
   d) baking said resin.

19. A process according to claim 18, wherein the resin is applied to the substrate by spinner method.

20. A process according to claim 18, wherein the photosensitive resin is an aromatic resin.

21. A process according to claim 20, wherein the aromatic resin is composed mainly of polyamide.

22. A process according to claim 20, wherein the aromatic resin is composed mainly of polyimide.

23. A process according to claim 18, wherein the photosensitive resin contains a coloring material.

24. A process according to claim 18, wherein the oxygen-containing atmosphere is air.

25. A process according to claim 18, wherein the process further contains a step of dyeing the photosensitive resin.

26. A process according to claim 18, wherein the photosensitive resin is prebaked by heating after it is applied to the substrate and before the light exposure.

27. A process according to claim 18, wherein the application of the photosensitive resin to the substrate, the light exposure and the development are repeated at least twice.

28. A process according to claim 18, wherein the filter has at least one color species selected from the group consisting of red, green, blue and colorless.

* * * * *

UNITED STATES PATENT AND TRADEMARK OFFICE
CERTIFICATE OF CORRECTION

PATENT NO. : 5,830,608
DATED : November 3, 1998
INVENTOR(S) : KAZUYA ISHIWATA ET AL.

It is certified that error appears in the above-identified patent and that said Letters Patent is hereby corrected as shown below:

COLUMN 5

Line 52, "are" should read --are the--.

COLUMN 6

Line 16, "be" (first occurrence) should read --been--.

COLUMN 8

Line 36, "led" should read --subjected--.
    Line 42, "an" should read --a--.

COLUMN 9

Line 15, "is" should read --it is--.

Signed and Sealed this

Seventh Day of September, 1999

Attest:

Q. TODD DICKINSON

Attesting Officer      Acting Commissioner of Patents and Trademarks